United States Patent
Yang et al.

(10) Patent No.: US 10,699,845 B2
(45) Date of Patent: Jun. 30, 2020

(54) CAPACITOR COMPONENT AND METHOD OF MANUFACTURING THE SAME

(71) Applicant: SAMSUNG ELECTRO-MECHANICS CO., LTD., Suwon-si, Gyeonggi-do (KR)

(72) Inventors: Jeong Suong Yang, Suwon-si (KR); Seung Hun Han, Suwon-si (KR); Sung Min Cho, Suwon-si (KR); Chang Soo Jang, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/965,528

(22) Filed: Apr. 27, 2018

(65) Prior Publication Data
US 2019/0131069 A1    May 2, 2019

(30) Foreign Application Priority Data
Oct. 31, 2017   (KR) .................. 10-2017-0143591

(51) Int. Cl.
*H01G 4/10* (2006.01)
*H01G 4/005* (2006.01)
*H01L 49/02* (2006.01)

(52) U.S. Cl.
CPC ............ *H01G 4/10* (2013.01); *H01G 4/005* (2013.01); *H01L 28/60* (2013.01)

(58) Field of Classification Search
CPC ........... H01G 4/10; H01G 4/005; H01L 28/60
See application file for complete search history.

(56) References Cited

U.S. PATENT DOCUMENTS

| 7,151,036 B1 | 12/2006 | Goldberger et al. |
| 7,670,920 B2 * | 3/2010 | Williams ............... H01L 28/60 |
| | | 257/296 |
| 2006/0267019 A1 | 11/2006 | Kim et al. |
| 2013/0154056 A1 | 6/2013 | Tonari |
| 2014/0290999 A1 | 10/2014 | Park et al. |

(Continued)

FOREIGN PATENT DOCUMENTS

| JP | 06302463 A | * 10/1994 |
| JP | 06302464 A | * 10/1994 |

(Continued)

OTHER PUBLICATIONS

Korean Office Action dated Dec. 17, 2018 issued in Korean Patent Application No. 10-2017-0143591 (with English translation).

*Primary Examiner* — Nathan Milakovich
(74) *Attorney, Agent, or Firm* — Morgan, Lewis & Bockius LLP

(57) ABSTRACT

A capacitor component includes a dielectric including a first main surface and a second main surface facing each other, and at least one end surface that connects the first main surface and the second main surface, the dielectric being vertically disposed by positioning the at least one end surface on a lower surface of the capacitor component, and a first electrode and a second electrode that are disposed on the first main surface and the second main surface of the dielectric, respectively, wherein a size of each of the first electrode and the second electrode is greater than a size of the dielectric.

18 Claims, 3 Drawing Sheets

(56) References Cited

U.S. PATENT DOCUMENTS

| | | | | |
|---|---|---|---|---|
| 2015/0028449 A1* | 1/2015 | Adkisson | .......... | H01L 21/76224 |
| | | | | 257/532 |
| 2015/0090485 A1* | 4/2015 | Lee | ........................ | H01G 2/065 |
| | | | | 174/260 |
| 2017/0075148 A1* | 3/2017 | Baudot | .................... | G02F 1/025 |
| 2019/0237251 A1* | 8/2019 | Jang | ........................ | H01G 4/252 |

FOREIGN PATENT DOCUMENTS

| | | | |
|---|---|---|---|
| JP | 2013-125955 A | | 6/2013 |
| KR | 10-0634241 B1 | | 10/2006 |
| KR | 20100002694 A | * | 1/2010 |
| KR | 10-2011-0077162 A | | 7/2011 |
| KR | 10-2014-0118213 A | | 10/2014 |

* cited by examiner

CAPACITOR COMPONENT AND METHOD OF MANUFACTURING THE SAME

CROSS-REFERENCE TO RELATED APPLICATION(S)

This application is based on and claims the benefit of priority to Korean Patent Application No. 10-2017-0143591 filed on Oct. 31, 2017 in the Korean Intellectual Property Office, the entire disclosure of which is incorporated herein by reference.

TECHNICAL FIELD

The present disclosure relates to a capacitor component and a method of manufacturing the same.

BACKGROUND

Recently, applications requiring high data transmission capacity, such as virtual reality (VR), have become commercially available. For high data transmission capacity, $5^{th}$ generation (5G) mobile communications are required and, accordingly, in recent times there has been an increasing need for 5G mobile communications. Thus far, a frequency band of 5G mobile communications has not been clearly standardized but it is expected that a high frequency in a range of several tens of GHz will be used. In general, a capacitor has the characteristics of an inductor at such a high frequency and, thus, may be embodied through a metallic pattern such as a microstrip. However, when a microstrip is designed to be installed in a substrate, a yield may be remarkably reduced due to a defective pattern. Accordingly, when a capacitor for a high frequency is manufactured separately and installed in a substrate, the capacitor may be replaced with a microstrip, thereby generating a high yield.

In the case of typical multilayer ceramic capacitors (MLCCs) manufactured via powder sintering, it is difficult to embody low-capacity capacitance, based on a distance between input and output terminals, due to a restriction in terms of chip design.

SUMMARY

An aspect of the present disclosure may provide a capacitor component and a method of manufacturing the same, for minimizing an interval between input and output terminals to provide low-capacity capacitance.

According to an aspect of the present disclosure, a capacitor component may include a dielectric including a first main surface and a second main surface facing each other, and at least one end surface that connects the first main surface and the second main surface, the dielectric being vertically disposed by positioning the at least one end surface on a lower surface of the capacitor component, and a first electrode and a second electrode that are disposed on the first main surface and the second main surface of the dielectric, respectively, wherein a size of each of the first electrode and the second electrode is greater than a size of the dielectric.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Exemplary embodiments in the present disclosure will now be described in detail with reference to the accompanying drawings.

Figure 1:
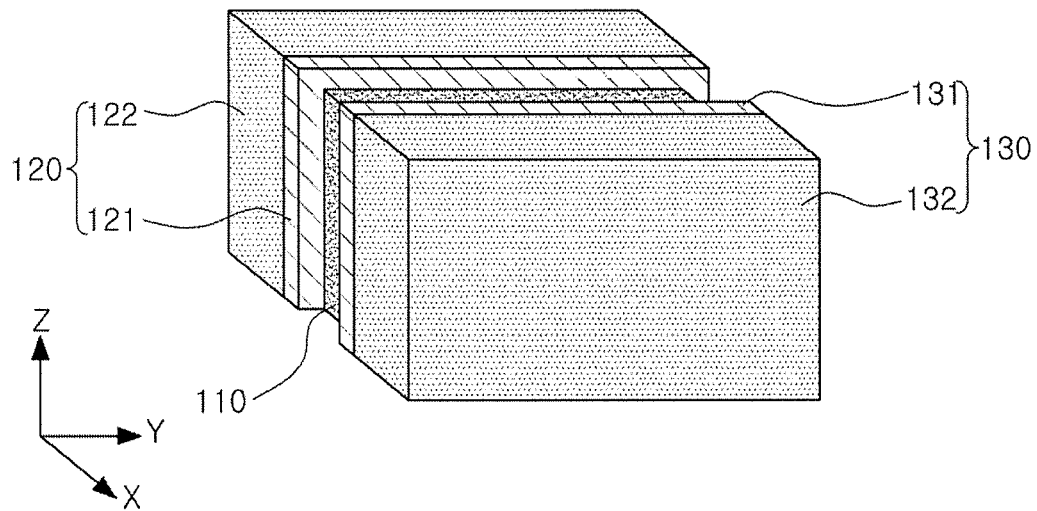
FIG. 1 is a perspective view of a capacitor component according to an exemplary embodiment in the present disclosure.

FIG. 1 is a perspective view of a capacitor component according to an exemplary embodiment in the present disclosure.

Referring to FIG. 1, the capacitor component may include a dielectric 110, a first electrode 120, and a second electrode 130.

The dielectric 110 may be disposed between the first electrode 120 and the second electrode 130 and may be formed of a material such as alumina ($Al_2O_3$), $SiO_2$, $Sn_3N_4$, $ZrO_2$, $CaTiO_3$, $SrTiO_3$, (Ba, Sr) $TiO_3$, and $BaTiO_3$ and, in some embodiments, the dielectric 110 may be formed of a plurality of materials to enhance dielectric characteristics.

Figure 2:
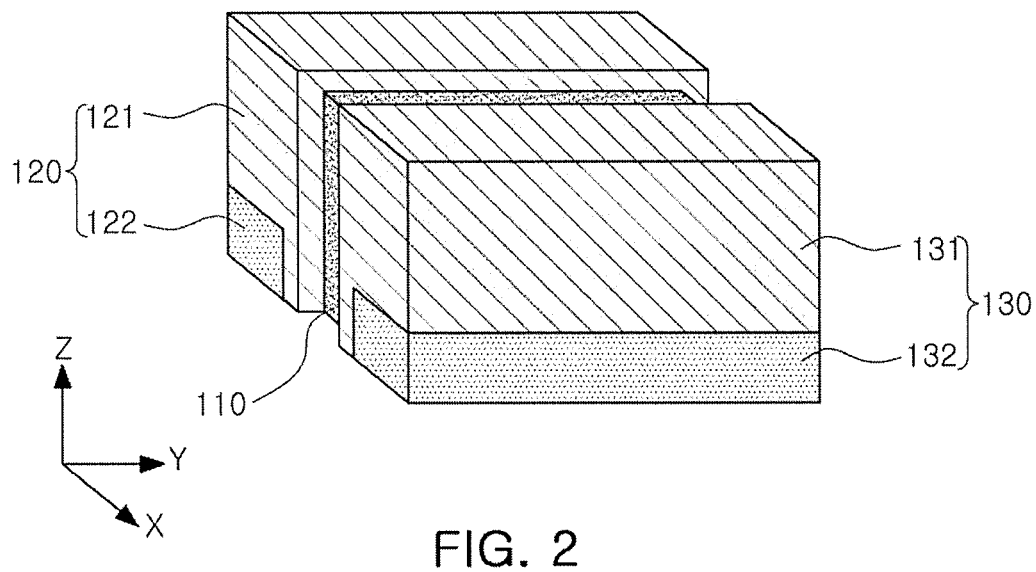
FIG. 2 is a perspective view of a capacitor component according to another exemplary embodiment in the present disclosure.

The dielectric 110 may include a first main surface and a second main surface facing each other, and at least one end surface that connects the first main surface and the second main surface to each other. A distance between the first main surface and the second main surface of the dielectric 110, i.e., a thickness of the dielectric 110, may be 10 μm to 100 μm and, more preferably, 10 μm to 50 μm. According to an exemplary embodiment in the present disclosure, the dielectric 110 may be prepared with a thickness of 10 μm to 100 μm or, more preferably, 10 μm to 50 μm to embody a low-capacity capacitance. In FIGS. 1 and 2, the first main surface and the second main surface of the dielectric 110 may correspond to surfaces formed by the Y and Z axes orthogonal to the X-axis.

A size of the first main surface and a size of the second main surface of the dielectric 110 may be greater than a size of the at least one end surface of the dielectric 110. For example, the first main surface and the second main surface of the dielectric 110 may be shaped like a rectangle, the at least one end surface may include first to fourth end surfaces that connect the first main surface and the second main surface and, thus, the dielectric 110 may be formed like a hexahedron. However, in some embodiments, the first main surface and the second main surface of the dielectric 110 may be formed in various shapes such as a circle, a triangle, and etc.

The dielectric 110 may be vertically disposed by positioning the at least one end surface at a lower portion of the capacitor component and positioning the first main surface and the second main surface at lateral portions. Accordingly, according to an exemplary embodiment in the present disclosure, the first electrode 120 and the second electrode 130 which are to be described below may be disposed respectively on the first main surface and the second main surface of the dielectric 110 that is vertically disposed, thereby minimizing a distance between input and output terminals.

The first electrode 120 may include a first main surface and a second main surface facing each other, and at least one end surface that connects the first main surface and the second main surface of the first electrode 120. The first main surface of the first electrode 120 may be disposed to face the first main surface of the dielectric 110.

The first main surface of the dielectric 110 may be disposed inside a region of the first main surface of the first electrode 120. Accordingly, a size of the first main surface of the first electrode 120 may be greater than a size of the first main surface of the dielectric 110. An edge of the first main surface of the dielectric 110 may be spaced apart from an edge of the first main surface of the first electrode 120 by a reference distance and, accordingly, the dielectric 110 may be disposed inside a region of the first main surface of the first electrode 120.

The first electrode 120 may include a first channel layer 121 and a first pad 122 which are sequentially disposed from the first main surface of the dielectric 110.

The first channel layer 121 may be formed by doping a substrate formed of silicon including at least one of polysilicon and single crystal silicon with one of P-type impurities and N-type impurities. The first pad 122 may include nickel (Ni) and may be electrically connected to an outer substrate that is disposed at a lower portion of the capacitor component in the Z-axis direction.

The second electrode 130 may be symmetrically disposed to the first electrode 120 with respect to the dielectric 110.

In detail, the second electrode 130 may include a first main surface and a second main surface facing each other, and at least one end surface that connects the first main surface and the second main surface of the second electrode 130. In this case, the first main surface of the second electrode 130 may be disposed to face the second main surface of the dielectric 110.

The second main surface of the dielectric 110 may be disposed inside a region of the first main surface of the second electrode 130. Accordingly, a size of the first main surface of the second electrode 130 may be greater than a size of the second main surface of the dielectric 110. An edge of the second main surface of the dielectric 110 may be spaced apart from an edge of the first main surface of the second electrode 130 by a reference distance and, accordingly, the dielectric 110 may be disposed inside a region of the first main surface of the second electrode 130.

The second electrode 130 may include a second channel layer 131 and a second pad 132 which are sequentially disposed from the second main surface of the dielectric 110.

The second channel layer 131 may be formed by doping a substrate formed of silicon including at least one of polysilicon and single crystal silicon with one of P-type impurities and N-type impurities. The second pad 132 may include nickel (Ni) and may be electrically connected to an outer substrate that is disposed at a lower portion of the capacitor component in the Z-axis direction.

FIG. 2 is a perspective view of a capacitor component according to another exemplary embodiment in the present disclosure. The capacitor component according to the exemplary embodiment illustrated in FIG. 2 is similar to the capacitor component according to the exemplary embodiment illustrated in FIG. 1. Thus, a repeated description thereof will be omitted and the capacitor component shown in FIG. 2 will be described in terms of a difference from the capacitor component shown in FIG. 1.

The first electrode 120 may include a first main surface and a second main surface facing each other, and at least one end surface that connects the first main surface and the second main surface of the first electrode 120. The first main surface of the first electrode 120 may be disposed to face the first main surface of the dielectric 110.

The first main surface of the dielectric 110 may be disposed inside a region of the first main surface of the first electrode 120. Accordingly, a size of the first main surface of the first electrode 120 may be greater than a size of the first main surface of the dielectric 110.

The first pad 122 may be disposed on the first channel layer 121 and, for example, the first pad 122 may be embedded in the first channel layer 121 to expose at least one surface of the first pad 122 in the first channel layer 121.

For example, at least one surface of the first pad 122 may be exposed in a lower region, i.e., a region within a threshold distance from a lower surface of the first channel layer 121. The first pad 122 may be exposed through a lower region of the second main surface of the first electrode 120, which is in a farther side from the dielectric 110 than the first main surface is, and at least one end surface that extends from the lower region of the second main surface of the first electrode 120.

The second electrode 130 may be symmetrically disposed to the first electrode 120 in relation to the dielectric 110.

The second electrode 130 may include a first main surface and a second main surface facing each other, and at least one end surface that connects the first main surface and the second main surface of the second electrode 130. In this case, the first main surface of the second electrode 130 may be disposed to face the second main surface of the dielectric 110.

The second main surface of the dielectric 110 may be disposed in a region of the first main surface of the second electrode 130. Accordingly, a size of the first main surface of the second electrode 130 may be greater than a size of the second main surface of the dielectric 110.

The second pad 132 may be disposed on the second channel layer 131 and, for example, the second pad 132 may be embedded in the second channel layer 131 in such a way that at least one surface of the second pad 132 is exposed in the second channel layer 131.

For example, at least one surface of the second pad 132 may be exposed in a lower region of the second channel layer 131. The second pad 132 may be exposed through a lower region of the second main surface of the second electrode 130, which is in a farther side from the dielectric 110 than the first main surface is, and at least one end surface that extends from the lower region of the second main surface.

FIGS. 3A to 3F are diagrams showing a process of manufacturing the capacitor component according to the exemplary embodiment illustrated in FIG. 1.

Figure 3A:
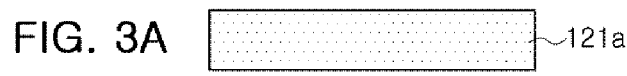
FIGS. 3A to 3F are diagrams showing a process of manufacturing the capacitor component according to the exemplary embodiment illustrated in FIG. 1.

Referring to FIGS. 3A to 3F, the process of manufacturing the capacitor component according to the exemplary embodiment illustrated in FIG. 1 may be started by preparing a first substrate 121a (FIG. 3A). The first substrate 121a may be formed of silicon including at least one of polysilicon and single crystal silicon and the silicon may be doped with one of P-type impurities and N-type impurities.

Figure 3B:
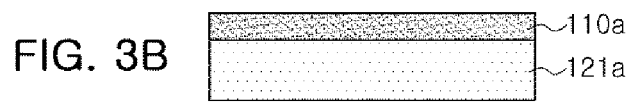

A dielectric layer 110a may be formed on one surface of the first substrate 121a (FIG. 3B). The dielectric layer 110a may be formed on the first substrate 121a via thermal oxidation and, for example, the dielectric layer 110a may include $SiO_2$.

Figure 3C:

A partial region of the dielectric layer 110a may be selectively removed to be divided into a plurality of regions (FIG. 3C). According to an exemplary embodiment in the present disclosure, the dielectric layer 110a may be divided into a plurality of regions via mechanical dicing and, thus, a deviation of the plurality of dielectric layers 110a may be minimized to precisely control a size of the dielectric layer 110a.

Figure 3D:
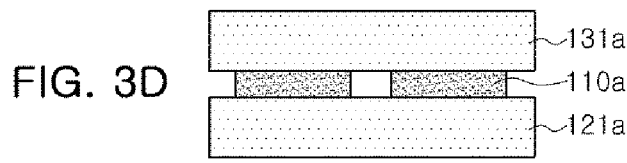

One surface of a second substrate 131a may be bonded to an upper portion of the dielectric layer 110a that is divided into a plurality of regions (FIG. 3D). One surface of the second substrate 131a may face the dielectric layer 110a. Like the first substrate 121a, the second substrate 131a may be formed of a semiconductor material such as polysilicon or single crystal silicon and the semiconductor material may further include one of P-type impurities and N-type impurities.

Figure 3E:
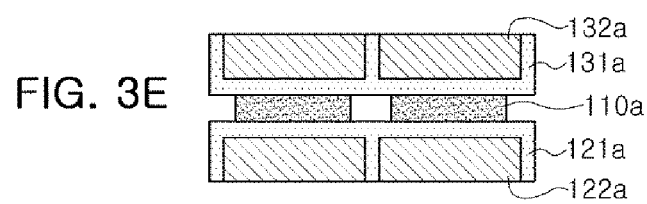

A groove that is concave in a stacking direction (i.e., X-axis direction) with a predetermined depth may be formed in the other surface of each of the first substrate 121a and the second substrate 131a may be formed to correspond to the dielectric layer 110a that is divided into a plurality of regions. Here, a portion of an entire area of the groove may overlap, in the stacking direction (i.e., the X-axis direction), an area of the dielectric layer 110a corresponding thereto. Then, a first pad layer 122a and a second pad layer 132a may be formed in the groove via plating (FIG. 3E).

Figure 3F:
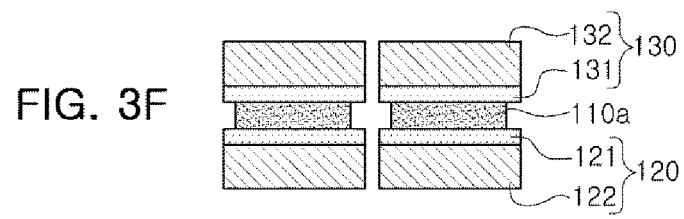

After the first pad layer 122a and the second pad layer 132a are formed, an external side of the first substrate 121a and the second substrate 131a may be cut in relation to the first pad layer 122a and the second pad layer 132a via dicing to manufacture a plurality of capacitor components shown in FIG. 1 (FIG. 3F).

FIGS. 4A to 4F are diagrams showing a process of manufacturing the capacitor component according to the exemplary embodiment illustrated in FIG. 2

Figure 4A:
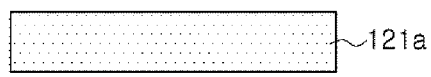
FIGS. 4A to 4F are diagrams showing a process of manufacturing the capacitor component according to the exemplary embodiment illustrated in FIG. 2.

Referring to FIGS. 4A to 4F, the process of manufacturing the capacitor component according to the exemplary embodiment illustrated in FIG. 2 may be started by preparing the first substrate 121a (FIG. 4A). The first substrate 121a may be formed of a semiconductor material such as polysilicon or single crystal silicon and the semiconductor material may further include one of P-type impurities and N-type impurities.

Figure 4B:
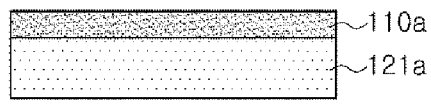

The dielectric layer 110a may be formed on one surface of the first substrate 121a (FIG. 4B). The dielectric layer 110a may be formed on the first substrate 121a via thermal oxidation and, for example, the dielectric layer 110a may include SiO2.

Figure 4C:
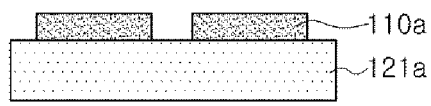
Figure 4D:
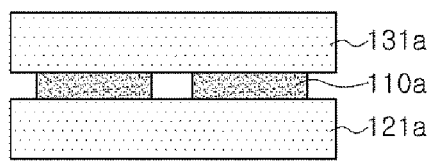

A partial region of the dielectric layer 110a may be selectively removed to be divided into a plurality of regions (FIG. 4C). According to an exemplary embodiment in the present disclosure, the dielectric layer 110a may be divided into a plurality of regions via mechanical dicing and, thus, a deviation of the plurality of dielectric layers 110a may be minimized to precisely control a size of the dielectric layer 110a.

One surface of the second substrate 131a may be disposed on an upper portion of the dielectric layer 110a that is divided into a plurality of regions (FIG. 4D) and one surface of the second substrate 131a may face the dielectric layer 110a. Like the first substrate 121a, the second substrate 131a may be formed of a semiconductor material such as polysilicon or single crystal silicon and the semiconductor material may further include one of P-type impurities and N-type impurities.

Figure 4E:
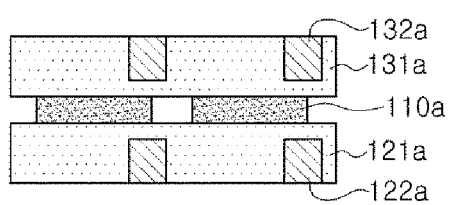

A via that extends in the stacking direction may be formed in the other surface of each of the first substrate 121a and the second substrate 131a to correspond to the dielectric layer 110a that is divided into a plurality of regions. Here, a portion of an entire area of the via may overlap, in the stacking direction, an area of the dielectric layer 110a corresponding thereto. Then, the first pad layer 122a and the second pad layer 132a may be formed in the via through plating (FIG. 4E).

Figure 4F:
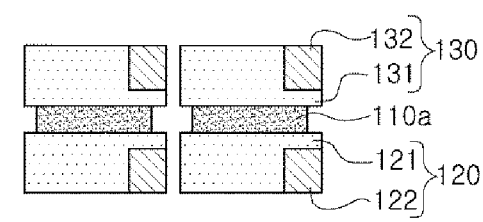

After the first pad layer 122a and the second pad layer 132a are formed, an external side of the first substrate 121a and the second substrate 131a may be cut in relation to the first pad layer 122a and the second pad layer 132a via dicing to manufacture a plurality of capacitor components shown in FIG. 2 (FIG. 4F).

According to an exemplary embodiment in the present disclosure, an interval between input and output terminals may be minimized to embody a low-capacity capacitance.

According to an exemplary embodiment in the present disclosure, a size of a dielectric may be smaller than that of an electrode to prevent a capacitance from being changed due to dicing or bonding that is subsequently performed and to prevent the dielectric from being damaged.

While exemplary embodiments have been shown and described above, it will be apparent to those skilled in the art that modifications and variations could be made without departing from the scope of the present disclosure as defined by the appended claims.

What is claimed is:

1. A capacitor component comprising:
    a dielectric including a first main surface and a second main surface facing each other, and at least one end surface that connects the first main surface and the second main surface to each other, the dielectric being vertically disposed by positioning the at least one end surface on a lower surface of the capacitor component; and
    a first electrode and a second electrode disposed on the first main surface and the second main surface of the dielectric, respectively,
    wherein an area of a surface of the first electrode facing the first main surface is larger than an area of the first main surface, and an area of a surface of the second electrode facing the second main surface is larger than an area of the second main surface, and
    wherein each of the first electrode and the second electrode has a hexahedral shape.

2. The capacitor component of claim 1, wherein a distance between the first main surface and the second main surface of the dielectric is 10 μm to 100 μm.

3. The capacitor component of claim 1, wherein an edge of the first main surface of the dielectric is spaced apart from an edge of the first electrode by a first reference distance, and an edge of the second main surface of the dielectric is spaced apart from an edge of the second electrode by a second reference distance.

4. The capacitor component of claim 1, wherein the first electrode includes a first channel layer and a first pad, sequentially disposed from the dielectric, and the second electrode includes a second channel layer and a second pad, sequentially disposed from the dielectric.

5. The capacitor component of claim 4, wherein each of the first and second channel layers is formed by doping a substrate formed of silicon including at least one of polysilicon and single crystal silicon with one of P-type impurities and N-type impurities.

6. The capacitor component of claim 4, wherein each of the first and second pads includes nickel (Ni).

7. The capacitor component of claim 4, wherein the first pad is embedded in the first channel layer to expose at least one surface of the first pad, and the second pad is embedded in the second channel layer to expose at least one surface of the second pad.

8. The capacitor component of claim 7, wherein the at least one surface of the first pad is exposed in a lower region of the first channel layer within a first threshold distance from a lower surface of the first channel layer, and
the at least one surface of the second pad is exposed in a lower region of the second channel layer within a second threshold distance from a lower surface of the second channel layer.

9. A method of manufacturing a capacitor component, comprising:
forming a dielectric layer on a first surface of a first substrate;
dividing the dielectric layer into a plurality of regions by removing a portion of the dielectric layer;
bonding a first surface of a second substrate to an upper portion of the dielectric layer divided into the plurality of regions;
forming one of a plurality of grooves and a plurality of vias in another surface of each of the first substrate and the second substrate and forming a pad layer on the one of the plurality of grooves and the plurality of vias of each of the first and second substrates; and
cutting the first and second substrates.

10. The method of claim 9, wherein the first substrate and the second substrate are each formed by doping a respective silicon substrate with one of P-type impurities and N-type impurities.

11. The method of claim 9, wherein the dielectric layer is formed on the first substrate via thermal oxidation.

12. The method of claim 9, wherein the one of the plurality of grooves and the plurality of vias of each of the first and second substrates is formed to correspond to the dielectric layer divided into the plurality of regions.

13. The method of claim 12, wherein a portion of an area of the one of the plurality of grooves and the plurality of vias of each of the first and second substrates overlaps an area of the dielectric layer corresponding thereto in a stacking direction.

14. The method of claim 9, wherein the pad layer is formed in the one of the plurality of grooves and in the plurality of vias of each of the first and second substrates by plating.

15. The method of claim 9, wherein the dividing of the dielectric layer includes selectively removing a portion of the dielectric layer formed on one surface of the first substrate via mechanical dicing.

16. A capacitor component comprising:
a dielectric including a first main surface and a second main surface facing each other, and at least one end surface that connects the first main surface and the second main surface to each other, the dielectric being vertically disposed by positioning the at least one end surface on a lower surface of the capacitor component; and
a first electrode and a second electrode disposed on the first main surface and the second main surface of the dielectric, respectively,
wherein an area of a surface of the first electrode facing the first main surface is larger than an area of the first main surface, and an area of a surface of the second electrode facing the second main surface is larger than an area of the second main surface,
wherein the first electrode includes a first channel layer and a first pad, sequentially disposed from the dielectric, and the second electrode includes a second channel layer and a second pad, sequentially disposed from the dielectric, and
wherein the first pad is embedded in the first channel layer to expose at least one surface of the first pad, and the second pad is embedded in the second channel layer to expose at least one surface of the second pad.

17. The capacitor component of claim 16, wherein a distance between the first main surface and the second main surface of the dielectric is 10 μm to 100 μm.

18. The capacitor component of claim 16, wherein an edge of the first main surface of the dielectric is spaced apart from an edge of the first electrode by a first reference distance, and an edge of the second main surface of the dielectric is spaced apart from an edge of the second electrode by a second reference distance.

* * * * *